US012615778B2

(12) United States Patent
Fujise

(10) Patent No.: US 12,615,778 B2
(45) Date of Patent: Apr. 28, 2026

(54) SEMICONDUCTOR STORAGE DEVICE

(71) Applicant: Kioxia Corporation, Tokyo (JP)

(72) Inventor: Shinya Fujise, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 379 days.

(21) Appl. No.: 18/327,446

(22) Filed: Jun. 1, 2023

(65) Prior Publication Data

US 2024/0107765 A1 Mar. 28, 2024

(30) Foreign Application Priority Data

Sep. 22, 2022 (JP) ................................. 2022-151846

(51) Int. Cl.
| | |
|---|---|
| *H10B 43/27* | (2023.01) |
| *H01L 23/00* | (2006.01) |
| *H01L 25/065* | (2023.01) |
| *H01L 25/18* | (2023.01) |
| *H10B 41/27* | (2023.01) |
| *H10B 80/00* | (2023.01) |

(52) U.S. Cl.
CPC ............. H10B 43/27 (2023.02); H01L 24/08 (2013.01); H01L 25/0657 (2013.01); H01L 25/18 (2013.01); H10B 41/27 (2023.02); H10B 80/00 (2023.02); *H01L 2224/08145* (2013.01); *H01L 2924/1431* (2013.01); *H01L 2924/14511* (2013.01)

(58) Field of Classification Search
CPC ........ H10B 43/27; H10B 80/00; H10B 41/27; H01L 24/08; H01L 25/0657; H01L 25/18; H01L 2224/08145; H01L 2924/1431; H01L 2924/14511
See application file for complete search history.

(56) References Cited

U.S. PATENT DOCUMENTS

| | | | |
|---|---|---|---|
| 9,337,207 B2 | 5/2016 | Park et al. | |
| 2020/0194456 A1* | 6/2020 | Baek ...................... | H10B 43/40 |
| 2021/0118902 A1* | 4/2021 | Kanamori ......... | H01L 21/31111 |

* cited by examiner

*Primary Examiner* — Peniel M Gumedzoe
(74) *Attorney, Agent, or Firm* — Foley & Lardner LLP

(57) ABSTRACT

A semiconductor storage device of an embodiment includes a plurality of conductive layers and a plurality of insulation layers, a first contact plug, and a second contact plug. The plurality of conductive layers and the plurality of insulation layers are alternately stacked in a first direction. The first contact plug contacts a first conductive layer included in the plurality of conductive layers and extends in the first direction. The second contact plug contacts a second conductive layer that is a conductive layer directly above the first conductive layer of the plurality of conductive layers and extends in the first direction through the first conductive layer. The second contact plug includes a second conductor layer, and an insulation layer that is provided between the second conductor layer and the first conductive layer and is configured to insulate the second conductor layer and the first conductive layer.

7 Claims, 14 Drawing Sheets

FIG. 4

SEMICONDUCTOR STORAGE DEVICE

CROSS-REFERENCE TO RELATED APPLICATIONS

This application is based upon and claims the benefit of priority from the prior Japanese Patent Application No. 2022-151846 filed on Sep. 22, 2022; the entire contents of which are incorporated herein by reference.

FIELD

An embodiment described herein relates generally to a semiconductor storage device.

BACKGROUND

A three-dimensional flash memory is known as a type of semiconductor storage device.

BRIEF DESCRIPTION OF THE DRAWINGS

FIG. 4 is an explanatory view showing an enlarged portion A2 that is a part of FIG. 3;

DETAILED DESCRIPTION

A semiconductor storage device of a present embodiment includes a plurality of conductive layers and a plurality of insulation layers, a first contact plug, and a second contact plug. The plurality of conductive layers and the plurality of insulation layers are alternately stacked in a first direction. The first contact plug contacts a first conductive layer included in the plurality of conductive layers and extends in the first direction. The second contact plug contacts a second conductive layer that is a conductive layer directly above the first conductive layer of the plurality of conductive layers and extends in the first direction through the first conductive layer. The second contact plug includes a second conductor layer, and an insulation layer that is provided between the second conductor layer and the first conductive layer and is configured to insulate the second conductor layer and the first conductive layer.

Hereinafter, an embodiment will be described with reference to the drawings.

Figure 1:
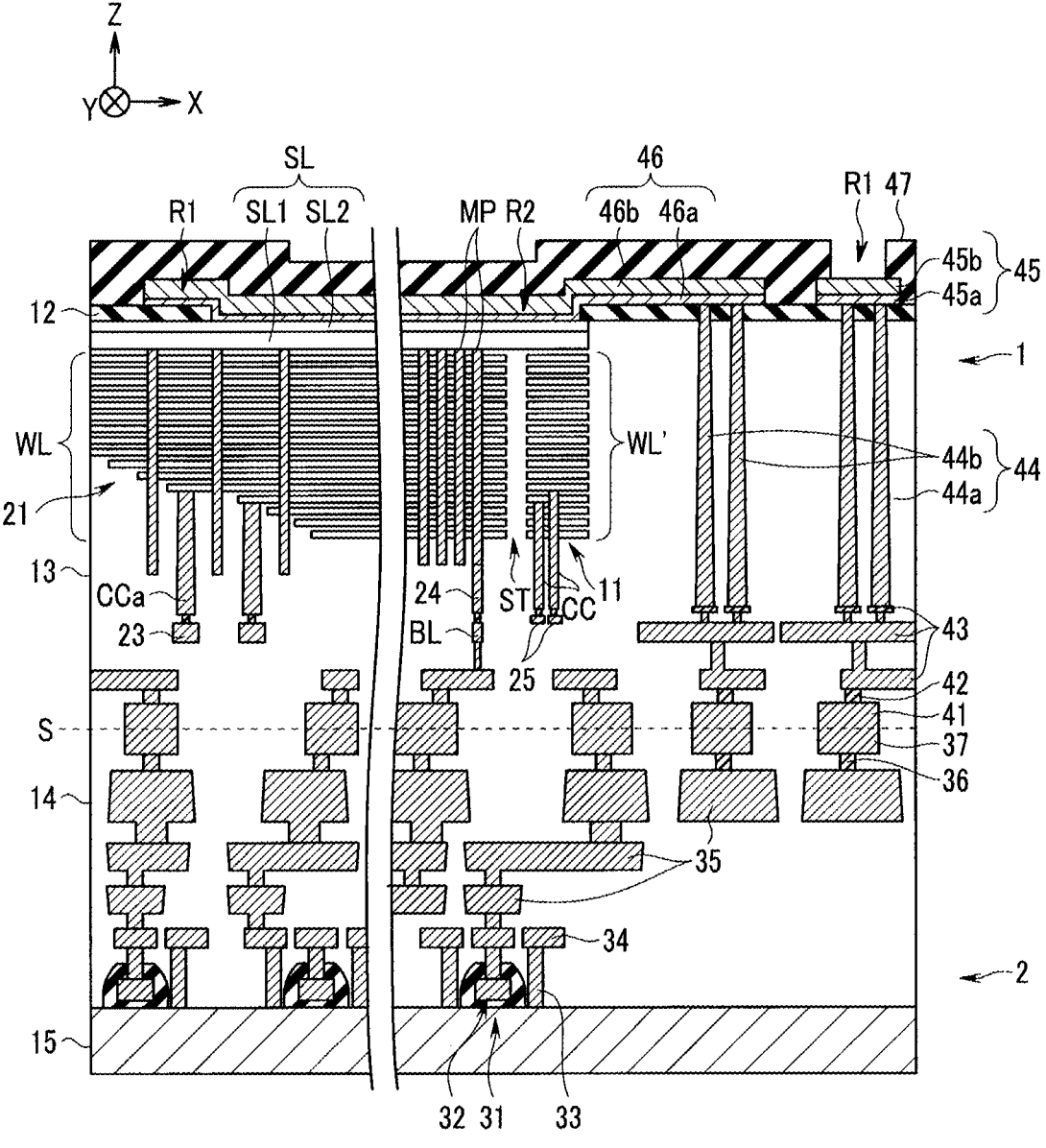
FIG. 1 is a sectional view showing a structure of a semiconductor storage device of an embodiment.

FIG. 1 is a sectional view showing a structure of a semiconductor storage device of the embodiment. The semiconductor storage device in FIG. 1 is a three-dimensional memory in which an array chip 1 and a circuit chip 2 are bonded together. More specifically, for example, the semiconductor storage device is a three-dimensional flash memory. Note that the array chip 1 has a structure in which memory hole processing onto a single stacked body is performed at only one time, but is not limited to the structure. For example, the array chip 1 may have a structure in which memory hole processing is performed separately onto each of two stacked bodies of top and bottom, accordingly the structure having a connection portion that connects top and bottom memory holes, for example, or may have a structure in which memory hole processing is performed separately onto each of three stacked bodies of top, middle and bottom, or the like.

The array chip 1 includes a memory cell array 11 including a plurality of memory cells, an insulation film 12 on the memory cell array 11, and an interlayer insulation film 13 under the memory cell array 11. The insulation film 12 is, for example, a silicon oxide film or a silicon nitride film. The interlayer insulation film 13 is, for example, a silicon oxide film or a stacked film including a silicon oxide film and other insulation films.

The circuit chip 2 is provided under the array chip 1. Reference sign S denotes a bonding surface of the array chip 1 and the circuit chip 2. The circuit chip 2 includes an interlayer insulation film 14, and a substrate 15 under the interlayer insulation film 14. The interlayer insulation film 14 is, for example, a silicon oxide film, or a stacked film including a silicon oxide film and other insulation films. The substrate 15 is, for example, a semiconductor substrate such as a silicon substrate.

FIG. 1 shows an X direction and a Y direction that are parallel to a surface of the substrate 15 and perpendicular to each other, and a Z direction perpendicular to the surface of the substrate 15. In the present description, a +Z direction is treated as an upward direction, and a –Z direction is treated as a downward direction. The –Z direction may or may not coincide with a direction of gravity.

As shown in FIG. 1, the array chip 1 includes a plurality of word lines WL, and a source line SL as a plurality of electrode layers in the memory cell array 11. The plurality of word lines WL are stacked in the Z direction via an interlayer insulation film. The memory cell array 11 includes a stair structure portion 21, and in the stair structure portion 21, the respective word lines WL are electrically connected to a word wiring layer 23 via contact plugs CCa. Each of memory pillars MP that penetrates through the plurality of word lines WL in a cell region is electrically connected to a bit line BL via a via plug 24, and is electrically connected to the source line SL. The source line SL is provided above the word lines WL. The source line SL is electrically connected to a source wiring layer 46 described later, on a top surface side of the source line SL. The source line SL includes a first layer SL1 that is a semiconductor layer, and a second layer SL2 that is a metal layer. The second layer SL2 is provided on the first layer SL1, and is provided to reduce electric resistance of the source line SL. The first layer SL1 is an n$^+$ type polysilicon layer, for example. The second layer SL2 is a tungsten silicide, for example.

In the present embodiment, conductive layers WL' configured by a same material as a material of the word lines WL are formed in same layers as layers of the word lines WL. The plurality of conductive layers WL' are each stacked in the Z direction via an interlayer insulation film. The plurality of conductive layers WL' are provided on an outside of the memory cell array 11.

The respective conductive layers WL' are electrically separated from the respective word lines WL by an insulation layer ST. A plurality of contact plugs CC are formed outside of the insulation layer ST, and are electrically connected to the different conductive layers WL' respectively. The respective conductive layers WL' are electrically connected to a wiring layer 25 via the contact plugs CC. The wiring layer 25 may be a layer at a same height as a height of the word wiring layer 23.

The circuit chip 2 includes a plurality of transistors 31. The transistors 31 each includes a gate electrode 32 provided on the substrate 15 via a gate insulation film, and a source diffusion layer and a drain diffusion layer that are not illustrated and provided in the substrate 15. The circuit chip 2 includes a plurality of contact plugs 33 provided on the source diffusion layers or the drain diffusion layers of the transistors 31, a wiring layer 34 that is provided on the contact plugs 33 and includes a plurality of wirings, and a plurality of wiring layers 35 that are provided on the wiring layer 34 and each includes a plurality of wirings.

The circuit chip 2 further includes a plurality of via plugs 36 provided on the wiring layers 35, and a plurality of metal pads 37 provided on the via plugs 36. The metal pad 37 is a copper (Cu) layer or an aluminum (Al) layer, for example. The circuit chip 2 of the present embodiment functions as a control circuit (logic circuit) that controls operation of the array chip 1. The control circuit is configured by the transistors 31 and the like, and is electrically connected to the metal pads 37. The control circuit includes a peripheral circuit of the memory cell array 11, for example.

The array chip 1 includes a plurality of metal pads 41 provided on the metal pads 37, a plurality of via plugs 42 provided on the metal pads 41, and a plurality of wiring layers 43 that are provided on the via plugs 42 and each includes a plurality of wirings. The metal pad 41 is a copper layer or an aluminum layer, for example. Further, the array chip 1 includes a plurality of via plugs 44 provided on the wiring layer 43, and the via plugs 44 include a plurality of via plugs 44a and a plurality of via plugs 44b. The via plugs 44 are provided sideward of the memory cell array 11, outside the memory cell array 11.

The array chip 1 further includes a metal pad 45, the source wiring layer 46, and a passivation film 47.

The metal pad 45 is provided on the via plugs 44a and the insulation film 12, and is electrically connected to the via plugs 44a by contacting the via plugs 44a. The metal pad 45 of the present embodiment functions as an external connection pad (bonding pad) of the semiconductor storage device.

The source wiring layer 46 is provided on the via plugs 44b, the memory cell array 11, and the insulation film 12, and is electrically connected to the via plugs 44b by contacting the via plugs 44b. The source wiring layer 46 includes a first portion R1 provided on the memory cell array 11 via the insulation film 12, and a second portion R2 provided on the memory cell array 11 in the insulation film 12. As a result, the source wiring layer 46 is provided on the source line SL so as to contact the source line SL, and is electrically connected to the source line SL.

The metal pad 45 and the source wiring layer 46 of the present embodiment are provided in a same wiring layer, and respectively include barrier metal layers 45a and 46a, and wiring material layers 45b and 46b on the barrier metal layers 45a and 46a. The barrier metal layers 45a and 46a are, for example, metal layers such as a titanium nitride film. The wiring material layers 45b and 46b are, for example, metal layers such as an aluminum layer.

The metal pad 45 and the source wring layer 46 of the present embodiment are respectively provided on the via plugs 44a and 44b that are provided to penetrate through the insulation film 12. Accordingly, upper ends of the via plugs 44a and upper ends of the via plugs 44b are provided at a higher position than a position of a top surface of the source line SL. Likewise, an undersurface of the metal pad 45, and an undersurface of the first portion R1 of the source wiring layer 46 are provided at a higher position than the position of the top surface of the source line SL. An undersurface of the second portion R2 of the source wiring layer 46 contacts the top surface of the source line SL. More specifically, the barrier metal layer 46a of the source wiring layer 46 contacts the second layer SL2 of the source line SL.

The passivation film 47 is provided on the metal pad 45, the source wiring layer 46, and the insulation film 12. The passivation film 47 is, for example, an insulation film such as a silicon oxide film, and has an opening portion P where the top surface of the metal pad 45 is exposed. The metal pad 45 can be connected to a mounting board or other devices through the opening portion P by a bonding wire, a solder ball, a metal bump, or the like.

As shown in FIG. 1, the memory cell array 11 is electrically connected to the circuit chip 2 via the metal pads 41 and 37 and the like under the memory cell array 11, and is electrically connected to the transistor 31 that configures a logic circuit, for example. This also applies to the metal pad 45 and the source wiring layer 46. The metal pad 45 is electrically connected to the circuit chip 2 via the via plugs 44a, and the metal pads 41 and 37 and the like under the via plugs 44a, and the source wiring layer 46 is electrically connected to the circuit chip 2 via the via plugs 44b, and the metal pads 41 and 37 and the like under the via plugs 44b. In the present embodiment, the memory cell array 11 is electrically connected to the transistor 31 in a section of FIG. 1. On a different section from the section of FIG. 1, the metal pad 45 is electrically connected to another one of the transistors 31, and the source wiring layer 46 is electrically connected to still another one of the transistors 31.

Figure 1A:
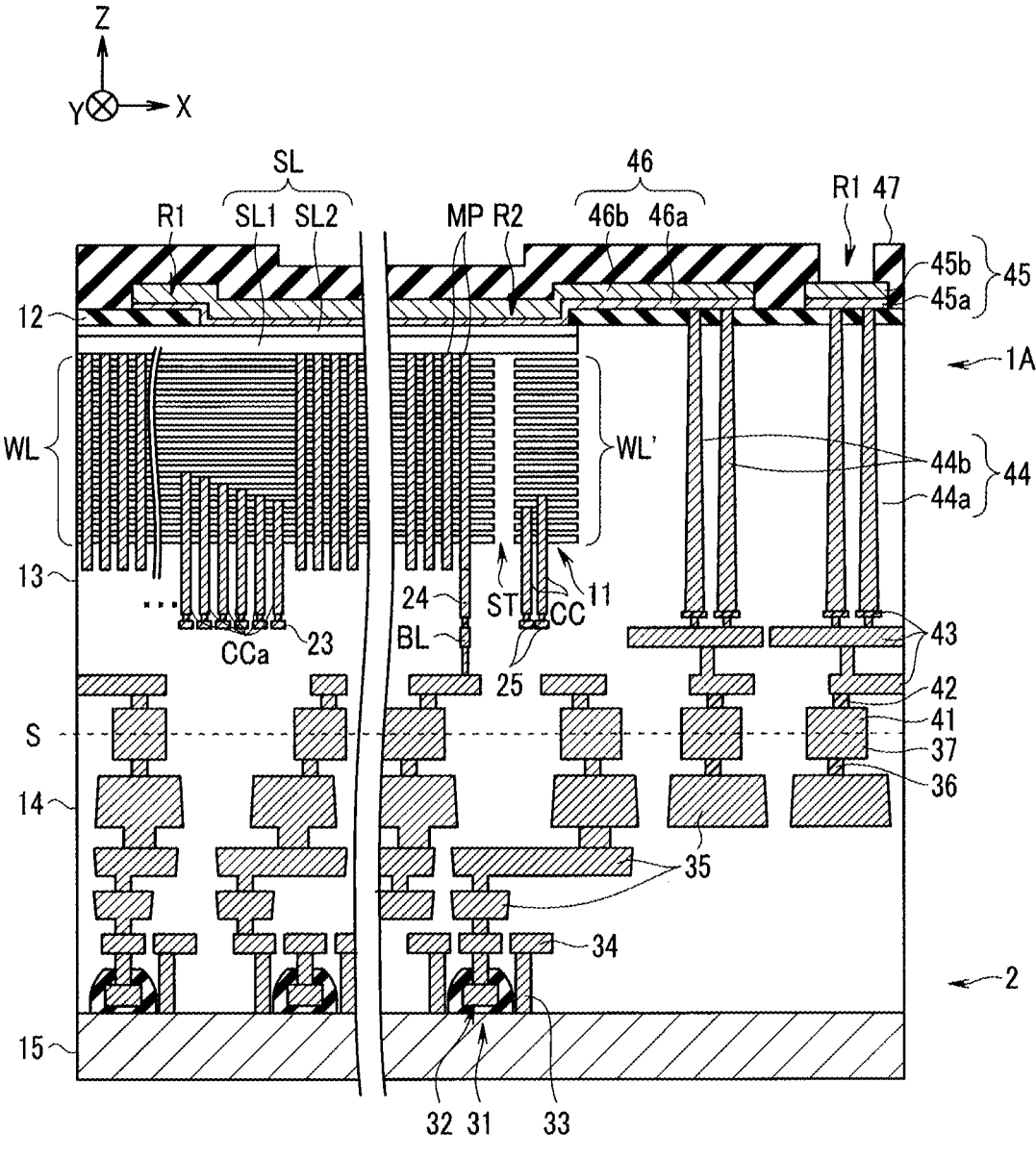
FIG. 1A is a sectional view showing another example of a structure of the semiconductor storage device of the embodiment.

FIG. 1A is a sectional view showing another example of the structure of the semiconductor storage device of the embodiment. Note that in FIG. 1A, similar components to the components in FIG. 1 are assigned with the same reference signs, and explanation is omitted.

In an array chip 1A shown in FIG. 1A, a stair structure portion is not provided in a memory cell array 11, and a plurality of contact plugs CCa are formed in a center portion of the memory cell array 11. In the embodiment, the contact plugs CCa can be collectively formed with contact plugs CC, and heights of the contact plugs CCa and the contact plugs CC that are formed in this way, more specifically, heights of lower ends in the −Z direction are the same.

Note that the contact plugs CCa are formed in the center portion of the memory cell array 11, but may be formed in an end portion of the memory cell array 11.

Figure 1B:
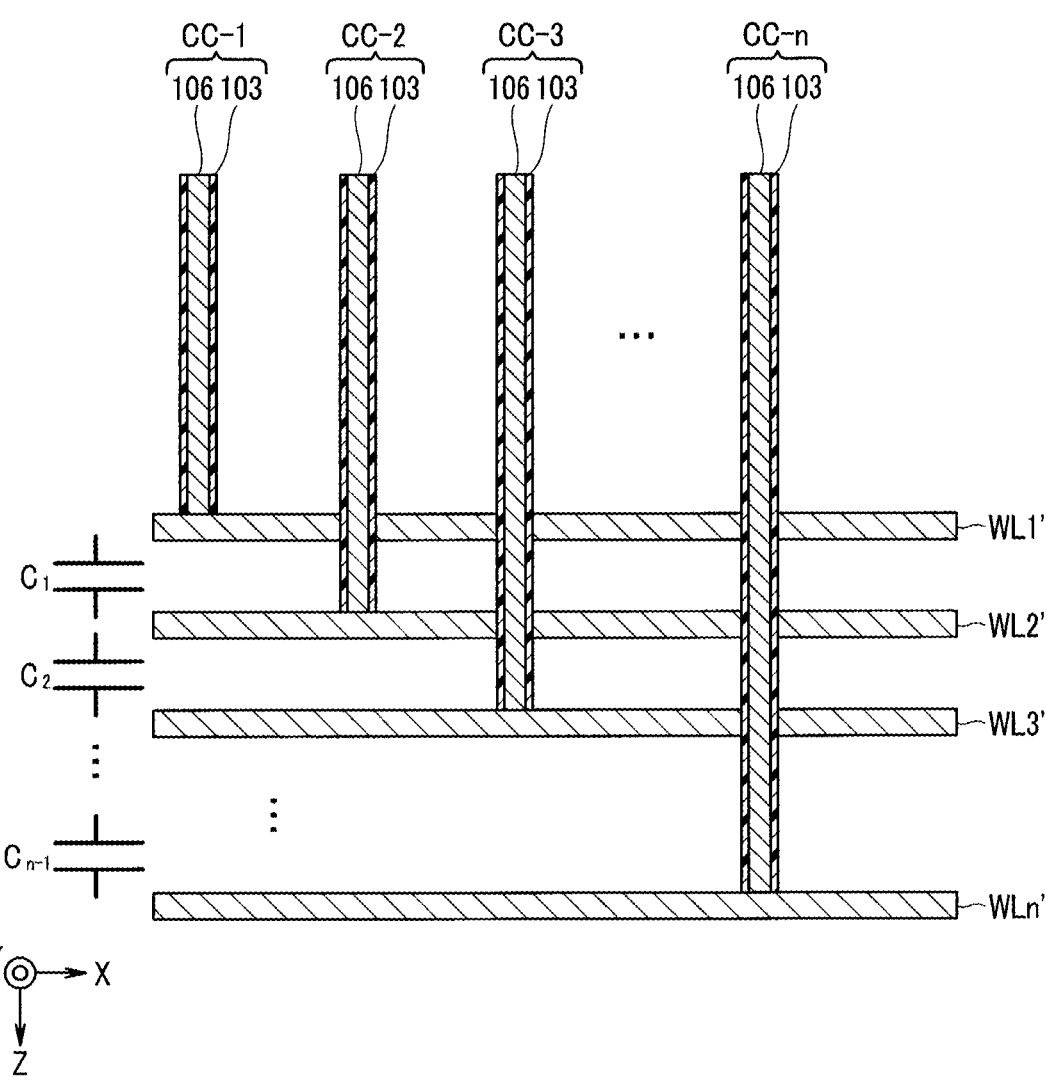
FIG. 1B is a view showing a connection relationship between contact plugs CC and conductive layers WL'.

FIG. 1B is a view showing a connection relationship between the contact plugs CC and conductive layers WL'.

As shown in FIG. 1B, contact plugs CC-1, CC-2, . . . , and CC-n are electrically connected to conductive layers WL1', WL2', WL3', . . . , and WLn' respectively. When the contact plugs CC-1, CC-2, . . . , and CC-n do not need to be distinguished from one another, the contact plugs CC-1, CC-2, . . . , and CC-n are hereinafter referred to as contact plugs CC as appropriate. In each of the contact plugs CC, a conductor layer 106 is formed in a center, and an insulation layer 103 is formed on an outside of the conductor layer 106. The insulation layer 103 electrically insulates the penetrated conductive layer WL' and the conductor layer 106, and is provided to be thick enough to prevent dielectric break-down.

By the configuration like this, interlayer capacitances $C_1$, $C_2$, . . . , and $C_{n-1}$ are formed respectively between the conductive layers WL1' and WL2', between the conductive layers WL2' and WL3', . . . , and between the conductive layers WLn-1' and WLn'. When the interlayer capacitances $C_1$, $C_2$, . . . , and $C_{n-1}$ do not need to be distinguished from one another, the interlayer capacitances $C_1$, $C_2$, . . . , and $C_{n-1}$ are hereinafter referred to as interlayer capacitances C as appropriate.

By connecting the interlayer capacitances C in parallel, it is possible to form a capacitive element with a larger capacitance. For example, when "n" is an even number, if the contact plugs CC-1, CC-3, . . . , and CC–(n–1) are electrically connected to one another by wiring, and the contact plugs CC-2, CC-4, . . . , and CC-n are electrically connected to one another by wiring, it is possible to form a capacitive element with an interlayer capacitance $C_1+C_2+ . . . +C_{n-1}$ between the contact plug CC-1 and the contact plug CC-2.

Next, a configuration of the contact plug CC of the present embodiment will be described by using FIG. 2 to FIG. 5.

Figure 2:
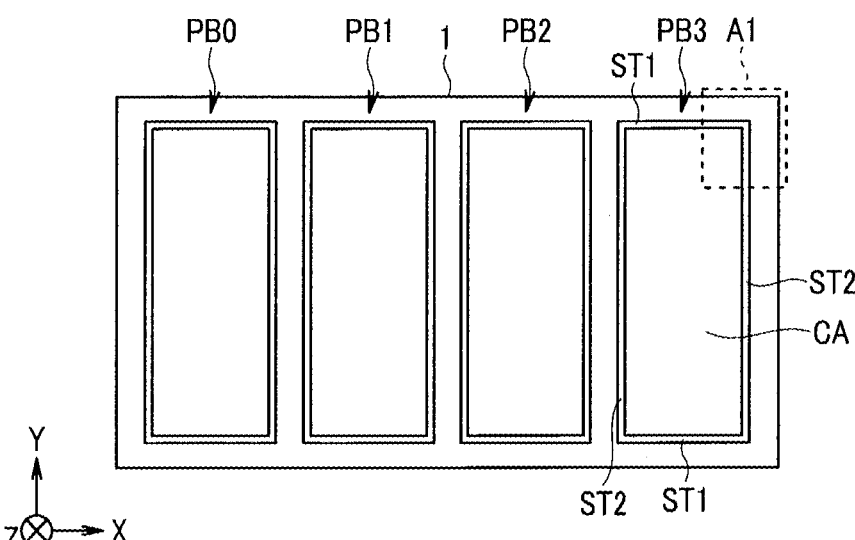
FIG. 2 is a plan view of one example of an array chip of the present embodiment.
Figure 3:
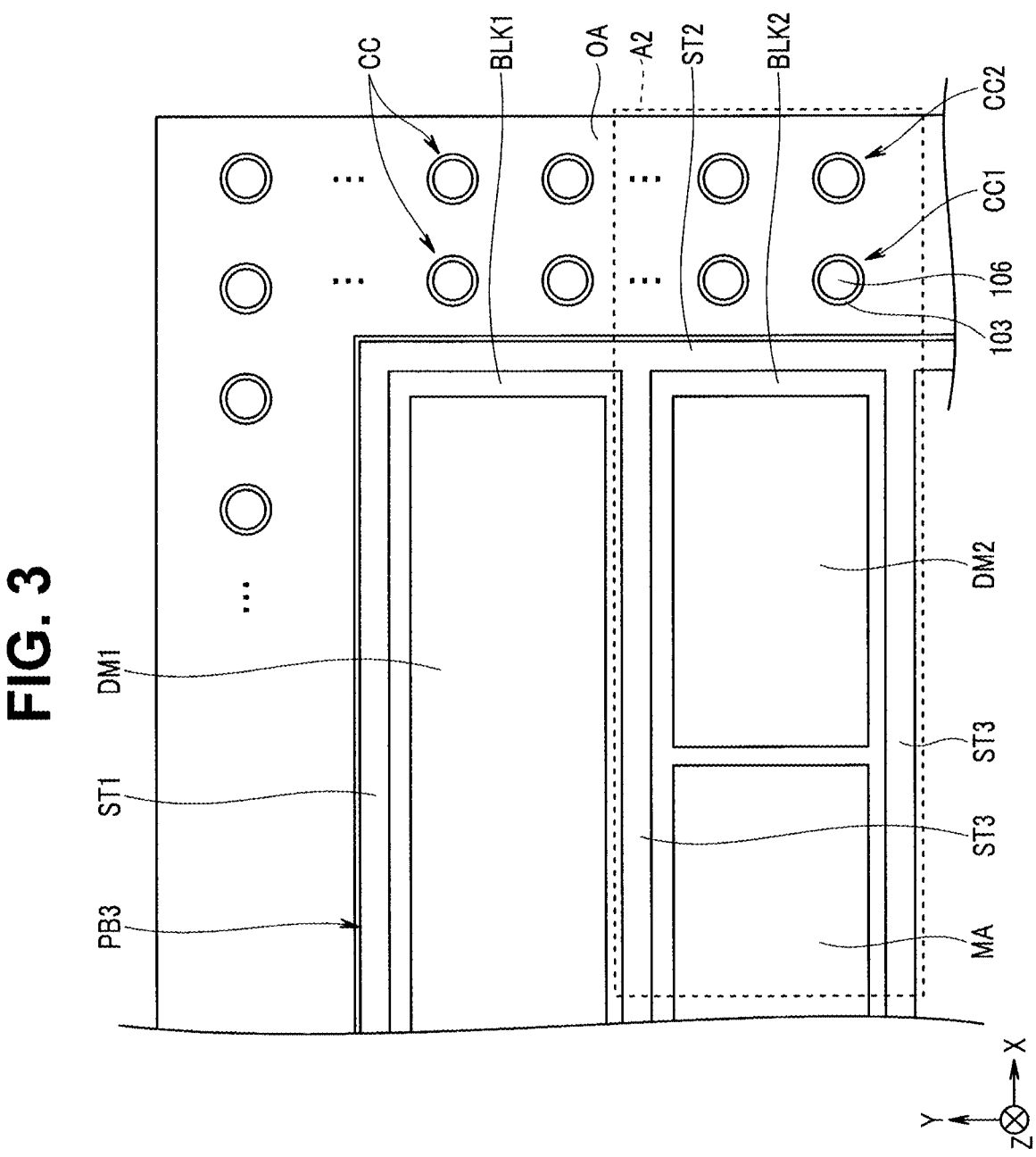
FIG. 3 is an explanatory view showing an enlarged portion A1 that is a part of FIG. 2.
Figure 4:
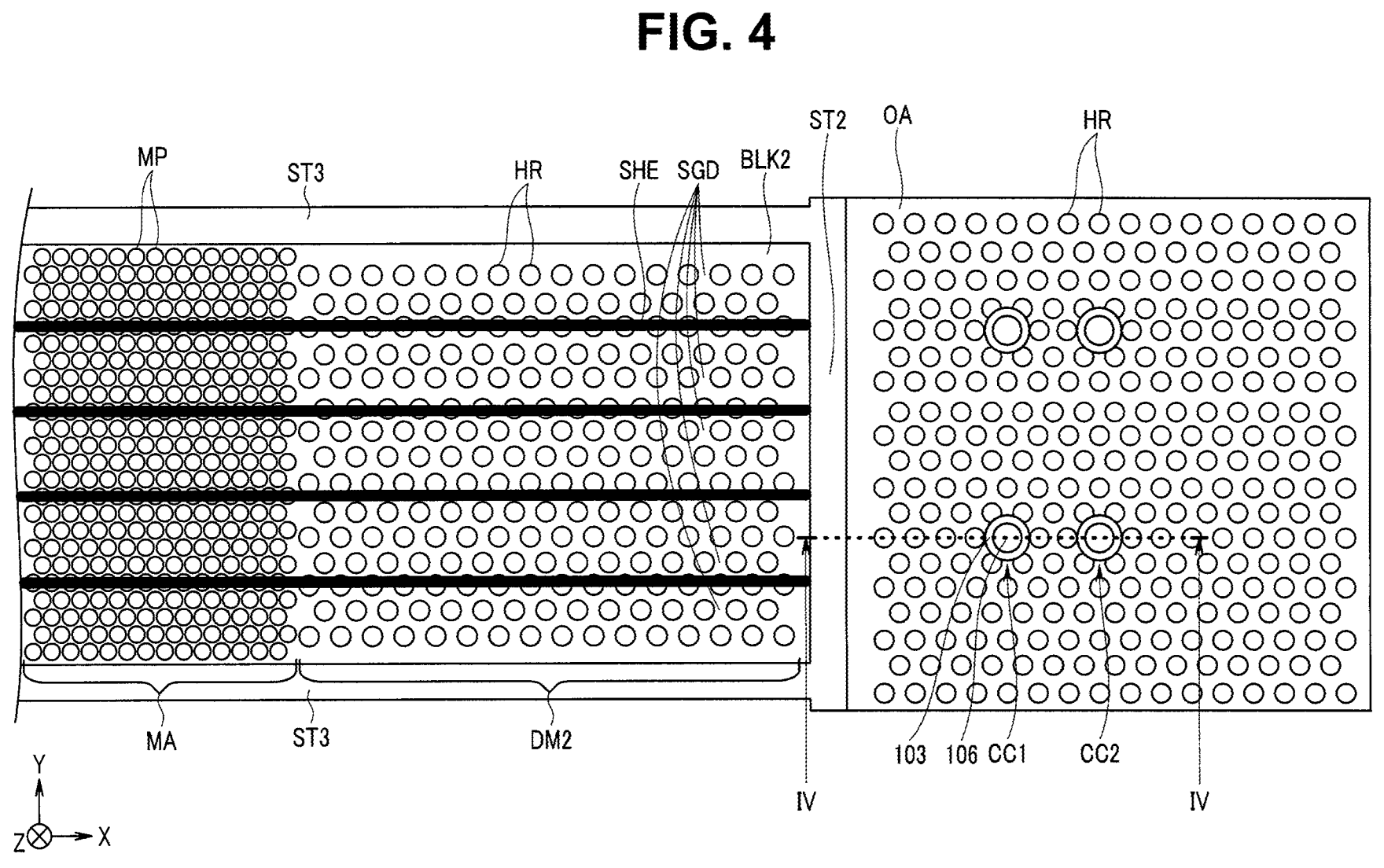

FIG. 2 is a plan view of an example of the array chip of the present embodiment. FIG. 3 is an explanatory view showing an enlarged portion A1 that is a part of FIG. 2. FIG. 4 is an explanatory view showing an enlarged portion A2 that is a part of FIG. 3. FIG. 5 is a sectional view along a line IV-IV in FIG. 4.

The array chip 1 has a plurality of planes PB0, PB1, PB2, and PB3. Note that when the plurality of planes PB0 to PB3 do not need to be distinguished from one another in the following explanation, the plurality of planes PB0 to PB3 are simply referred to as planes PB. FIG. 2 shows an example in which the number of planes PB is 4, but the number of planes included in the array chip 1 may be 2, 8, 16 or the like.

Each of the planes PB includes a cell region CA. Two insulation layers ST1 extending in the X direction, and two insulation layers ST2 extending in the Y direction are formed on a perimeter of the cell region CA. The insulation layers ST1 and ST2 are formed to penetrate through a plurality of word lines WL in the Z direction. Thereby, the respective planes PB are electrically separated by the insu-lation layers ST1 and ST2. The insulation layers ST1 and ST2 are respectively examples of a first insulation layer and a second insulation layer.

Further, as shown in FIG. 3, the cell region CA of the plane PB includes a plurality of blocks BLK1, BLK2, . . . . When the plurality of blocks BLK1, BLK2, . . . , do not need to be distinguished from one another, the plurality of blocks BLK1, BLK2, . . . , are simply referred to as blocks BLK. The respective blocks BLK are formed to penetrate through a plurality of word lines WL in the Z direction and are electrically separated by a plurality of insulation layers ST3 that extend in the X direction.

In the cell region CA, regions adjacent to the insulation layers ST1 and ST2 are dummy regions in which a memory cell transistor MT is not formed. Therefore, the block BLK1 is a dummy block where a dummy region DM1 is formed throughout the block BLK1.

In the block BLK2, a region adjacent to the insulation layer ST2 is a dummy region DM2. The block BLK2 has a memory cell array region MA in which the memory cell transistor MT is formed, inside the dummy region DM2.

In a region OA between an outside of the insulation layers ST1 and ST2 and a perimeter of the array chip 1, the conductive layers WL' which are configured by a same material as a material of the word lines WL are formed in same layers as layers of the word lines WL by replace described later, but the conductive layers WL' formed in the region OA are not used as the word lines WL. In the region OA in which the conductive layers WL' are formed, a plurality of contact plugs CC1 and CC2 are formed. The contact plugs CC1 and CC2 are respectively examples of a first contact plug and a second contact plug. Note that when the plurality of contact plugs CC1 and CC2 do not need to be distinguished from each other in the following explana-tion, the plurality of contact plugs CC1 and CC2 are simply referred to as contact plugs CC.

The plurality of contact plugs CC are formed to penetrate through a plurality of word lines WL in the Z direction, in the region OA outside of the insulation layers ST1 and ST2, and are respectively connected to different word lines WL. In each of the contact plugs CC, the conductor layer 106 is formed in a center, and the insulation layer 103 is formed on an outside of the conductor layer 106. The insulation layer 103 electrically insulates the penetrated conductive layer WL' and is provided to be thick enough to prevent dielectric breakdown.

As shown in FIG. 4, in the dummy regions DM1 and DM2, a plurality of support pillars HR that extend in the Z direction are formed. The respective support pillars HR are formed to penetrate through a plurality of word lines WL in the Z direction. The support pillars HR are provided for a purpose of reinforcing a plurality of insulation layers 101 (see FIG. 6A) during the replace described later when the array chip 1 is manufactured. The support pillar HR is configured by silicon oxide, for example.

In the memory cell array region MA, a plurality of memory pillars MP that extend in the Z direction are formed. The respective memory pillars MP are formed to penetrate through a plurality of word lines WL in the Z direction.

Figure 4A:
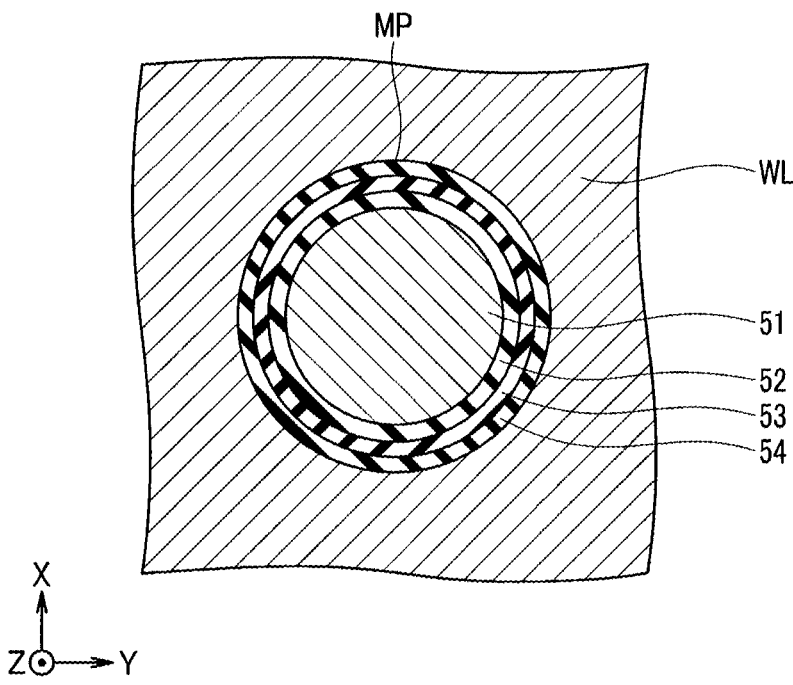
FIG. 4A is a sectional view of a memory pillar MP on a plane perpendicular to a Z direction.
Figure 5:
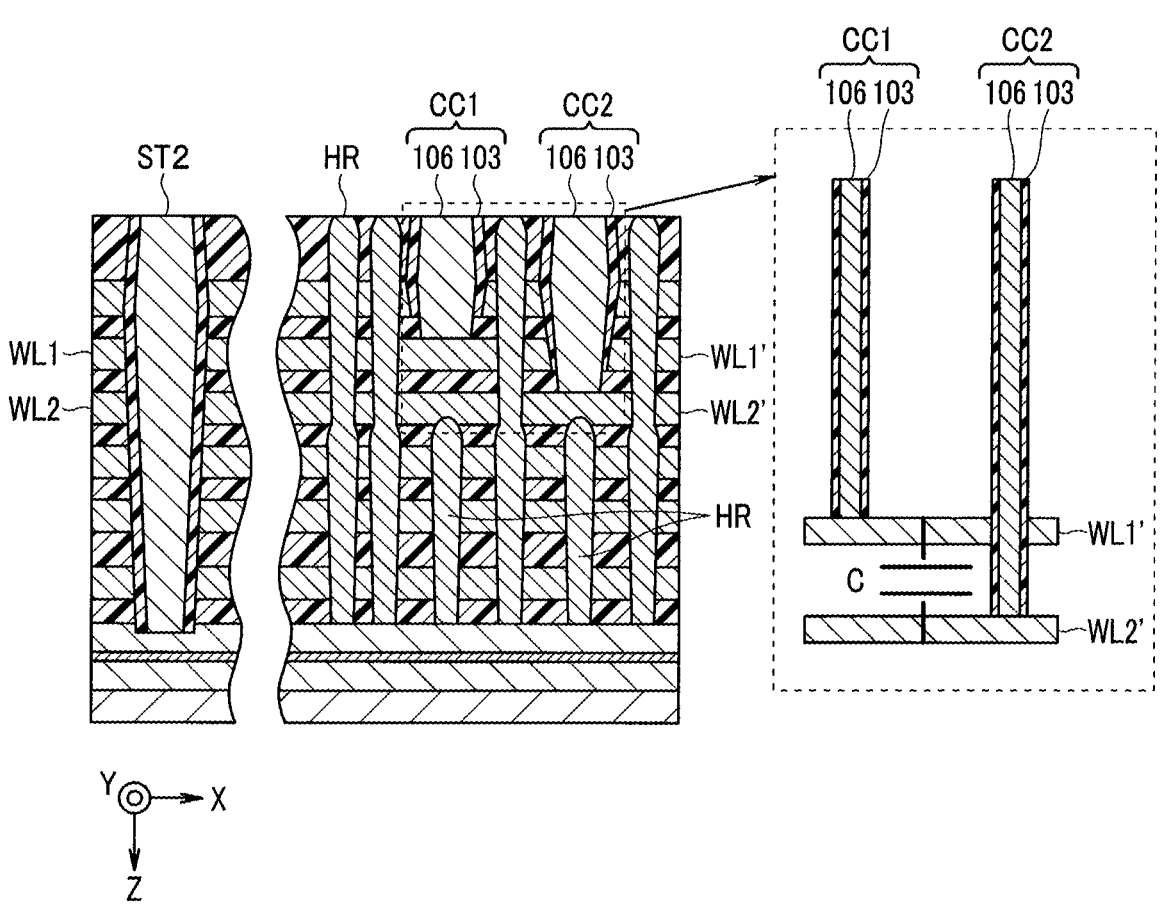
FIG. 5 is a sectional view along a line Iv-Iv in FIG. 4.

FIG. 4A is a sectional view of the memory pillar MP in a plane perpendicular to the Z direction.

As shown in FIG. 4A, the memory pillar MP includes, for example, a pillar-shaped semiconductor layer (semiconduc-tor pillar) 51 in a center side, a tunnel insulation film 52 formed on an outside of the semiconductor layer 51, a charge storage film 53 formed on an outside of the tunnel insulation film 52, and a block insulation film 54 formed on an outside of the charge storage film 53. For example, an intersection portion of the memory pillar MP and each of the plurality of word lines WL functions as a memory cell transistor (memory cell) MT.

Selection gate lines SGD not illustrated are respectively provided on a bit line BL side and a source line side of the plurality of word lines WL, and selection transistors are formed at intersections of the memory pillars MP and the selection gate lines SGD.

A plurality of insulation layers SHE are formed between the insulation layers ST3 that are adjacent to each other in the Y direction. The insulation layers SHE extend in the X direction and the Z direction, and separate the selection gate lines SGD in the Y direction.

For example, several ilm outside of the insulation layers ST1 and ST2 is a region to be replaced, and the conductive layer WL' of metal is present. The metal is, for example, tungsten or molybdenum. When a barrier metal such as titanium and titanium nitride is provided, for example, the conductive layer WL' contains titanium and titanium nitride. In the present embodiment, a plurality of contact plugs CC are formed in the region where the conductive layers WL' are present, outside of the insulation layers ST1 and ST2 to form interlayer capacitances.

A plurality of support pillars HR extending in the Z direction are formed in the region OA outside of the insulation layers ST1 and ST2. After the plurality of support pillars HR are formed, the contact plugs CC are formed in the region OA outside of the insulation layers ST1 and ST2. Note that the contact plugs CC may be formed before the support pillars HR, although this is different from the present embodiment.

As shown in FIG. 5, the conductor layer 106 of the contact plug CC1 is provided on the conductive layer WL1' in contact with the conductive layer WL1'. Further, the conductor layer 106 of the contact plug CC2 penetrates through the conductive layer WL1' in the Z direction, and is provided to be in contact with the conductive layer WL2'.

The insulation layers 103 are formed on outsides of the conductor layers 106 of the contact plugs CC1 and CC2. Therefore, the conductor layers 106 of the contact plugs CC1 and CC2 are not electrically connected to the other conductive layers WL' than the conductive layers WL' where the conductor layers 106 are provided. The interlayer capacitance C between the conductive layers WL1' and WL2' can be caused to function as a capacitive element by using the contact plug CC1 and the contact plug CC2 as terminals at both ends.

Next, one example of a method for manufacturing the contact plugs CC in the present embodiment will be described. FIG. 6A to FIG. 6F are sectional views showing one example of a manufacturing process of the contact plugs CC of the present embodiment.

Hereinafter, as a method for forming the conductive layer WL' (word line WL), a case of using a method of forming a structure corresponding to the conductive layer WL' (word line WL) with a sacrificial layer, and thereafter removing the sacrificial layer and replacing the sacrificial layer with a conductive material (hereinafter, described as "replace") will be described.

First, on a semiconductor substrate 100, insulation layers 101 and sacrificial layers 102 corresponding to conductive layers to be the word lines WL' (word lines WL) are alternately stacked, by CVD (chemical vapor deposition) or the like. For the sacrificial layer 102, a material having a high selection ratio with respect to wet etching corresponding to the insulation layer 101 is used. For example, when the insulation layer 101 is formed of a silicon oxide film, a silicon nitride film is used for the sacrificial layer 102.

Figure 6A:
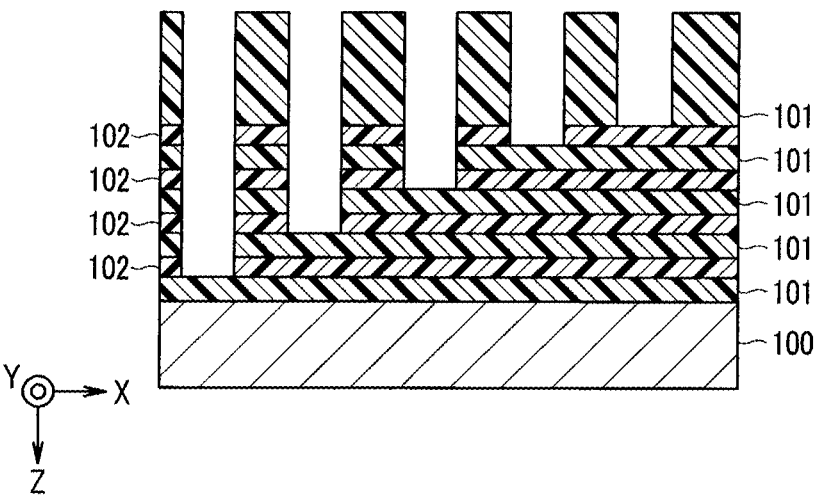
FIG. 6A is a sectional view showing one example of a manufacturing process of the contact plugs CC of the present embodiment.

Next, the contact plugs CC are formed. More specifically, a hard mask is formed on a top surface of the insulation layer 101 on an uppermost layer, and the hard mask on formation regions of the contact plugs CC is removed. In other words, the hard mask is patterned so that the insulation layers 101 are exposed only in the formation regions of the contact plugs CC. Next, the insulation layers 101, the sacrificial layers 102, and the insulation layers are penetrated by using anisotropic etching to form deep holes (holes). At this time, the structure shown in FIG. 6A is formed by forming a plurality of holes with different depths by using anisotropic etching while changing formation of the hard mask.

Figure 6B:
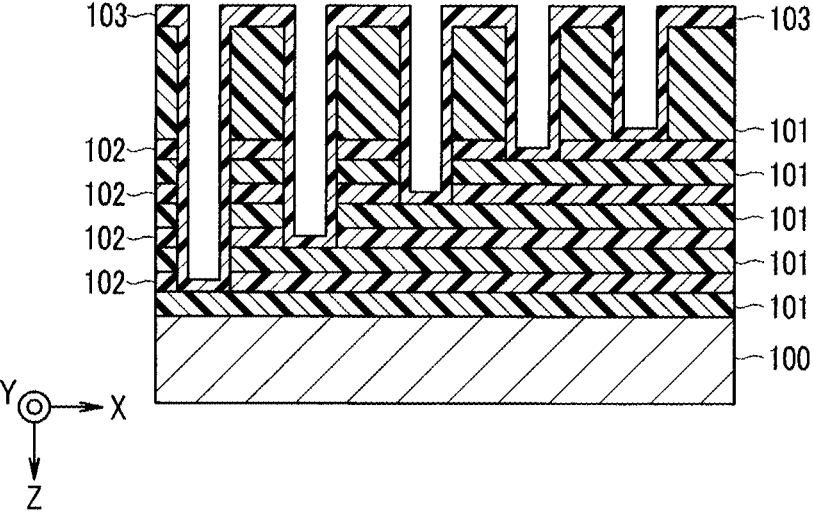
FIG. 6B is a sectional view showing one example of the manufacturing process of the contact plugs CC of the present embodiment.

Subsequently, the insulation layer 103 of silicon dioxide or the like is formed in the holes by CVD or the like, and thereby a structure shown in FIG. 6B is formed.

Figure 6C:
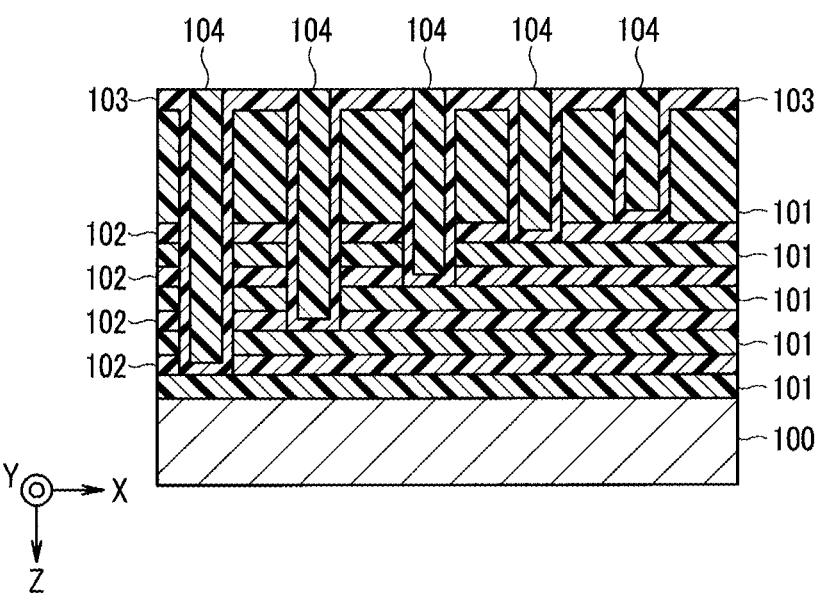
FIG. 6C is a sectional view showing one example of the manufacturing process of the contact plugs CC of the present embodiment.

Subsequently, a semiconductor layer 104 of amorphous silicon or the like is embedded in the holes by CVD or the like. Subsequently, etch-back (etching an entire surface of portions exposed to a top surface by anisotropic etching without using a hard mask) is performed, and a semiconductor layer 104 on a top surface of the insulation layer 103 is removed, whereby a structure shown in FIG. 6C is formed.

Figure 6D:
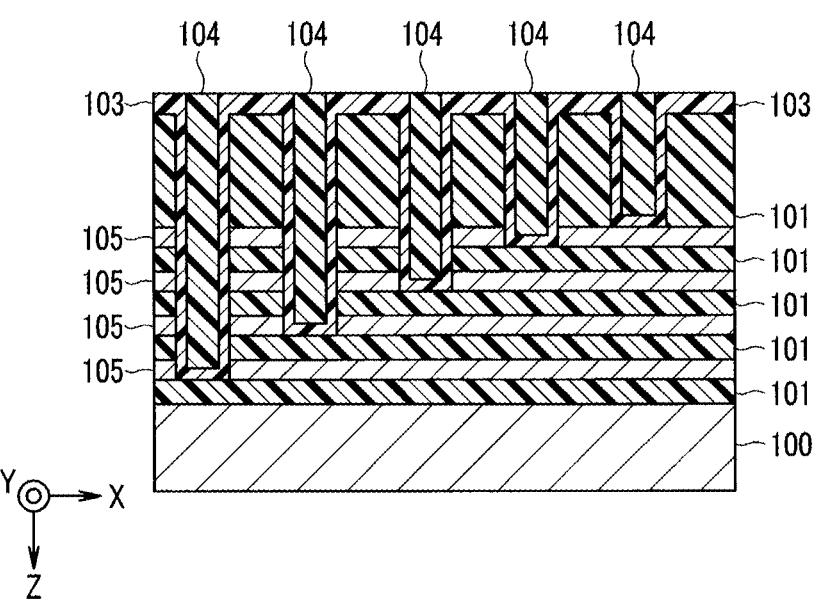
FIG. 6D is a sectional view showing one example of the manufacturing process of the contact plugs CC of the present embodiment.

Subsequently, replace is performed. More specifically, a slit SL with a bottom surface reaching the semiconductor substrate 100 is worked in a predetermined place by anisotropic etching. Next, the sacrificing layers 102 are removed from the slit SL to form an air gap by wet etching. After a conductor film (for example, tungsten) is embedded in the air gap, the conductor film that is formed in the slit SL and on the insulation layer 101 on the uppermost layer is removed to form a conductive layer 105. Then, an insulation layer is embedded in the slit SL. Thereby, the replace is completed, formation of the conductive layers 105 to be the conductive layers WL' (word lines WL) is completed, and a structure shown in FIG. 6D is formed.

Figure 6E:
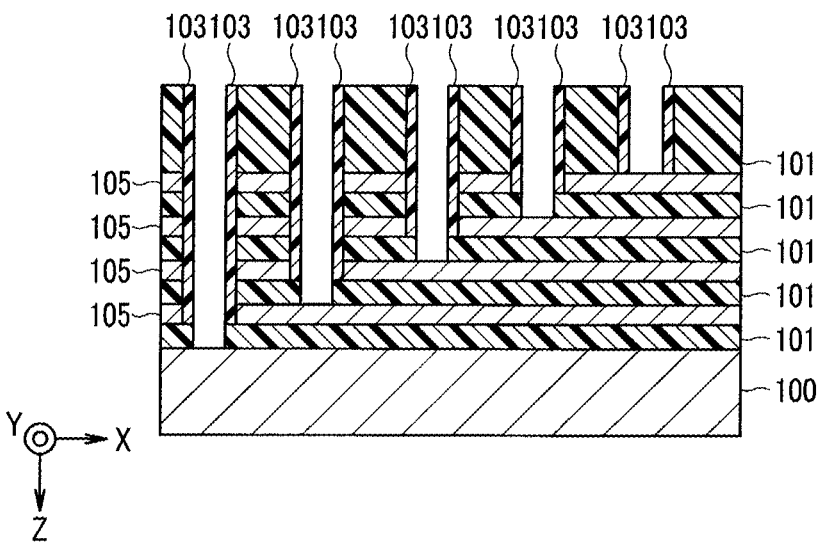
FIG. 6E is a sectional view showing one example of the manufacturing process of the contact plugs CC of the present embodiment.

Subsequently, the insulation layer 103 and the insulation layer 101 on the uppermost layer, and the insulation layer 103 and the insulation layer 101 on a hole bottom surface are removed by using anisotropic etching or the like, and the conductive layer 105 and the substrate 100 are exposed on the bottom surface of the hole, whereby a structure shown in FIG. 6E is formed.

Figure 6F:
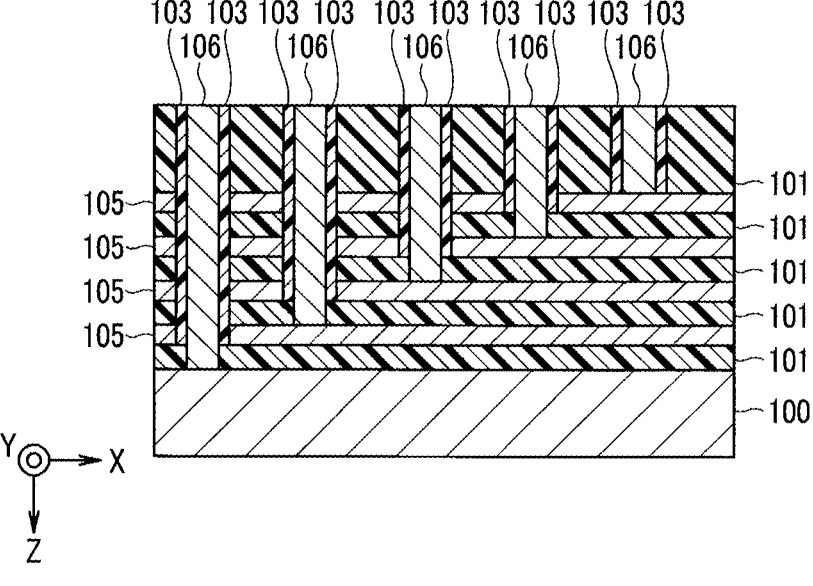
FIG. 6F is a sectional view showing one example of the manufacturing process of the contact plugs CC of the present embodiment.

Subsequently, the conductor layer 106 of tungsten or the like, for example, is embedded in the exposed holes, by CVD or the like. Finally, the conductor layer 106 formed on the insulation layer 101 on the uppermost layer is removed by CMP (chemical mechanical polishing) to form the contact plugs CC. By executing the above procedure, a structure shown in FIG. 6F is formed.

Note that in the present embodiment, the contact plugs CC are formed in all the conductive layers WL' that configure the stacked body, but regardless of this, the contact plugs CC may be formed in only some of the conductive layers WL' that configure the stacked body, for example.

A method for forming contact plugs CCa in the present embodiment (embodiment without being provided with a stair structure portion) is the same as the method for forming the contact plugs CC described above except that the contact plugs are formed in the conductive layers WL' instead of the word lines WL. Therefore, explanation of the method for forming the contact plugs CCa is omitted.

As above, in the array chip 1, a plurality of contact plugs CC are formed in the region where the conductive layers WL' are formed, outside of the planes PB (outside of the insulation layers ST1 and ST2). The conductive layers WL' formed outside of the planes PB are not particularly used.

The array chip 1 of the present embodiment can use the interlayer capacitance C between the conductive layers WL' as the capacitive element by forming the plurality of contact plugs CC, as terminals, in the region where the conductive layers WL' are formed, outside of the planes PB as described above.

In particular, the contact plug CC of the present embodiment electrically insulates the penetrated conductive layer WL' and is provided to be thick enough to prevent dielectric breakdown. By the configuration like this, the contact plug CC is not electrically connected to the penetrated conductive layer WL', and the interlayer capacitance C between the conductive layers WL' can be properly used.

By the above, in the array chip 1 of the present embodiment, it is possible to utilize the region where the conductive layers that are not used are formed, outside of the plane.

Modification 1

Next, Modification 1 will be described.

Figure 7:
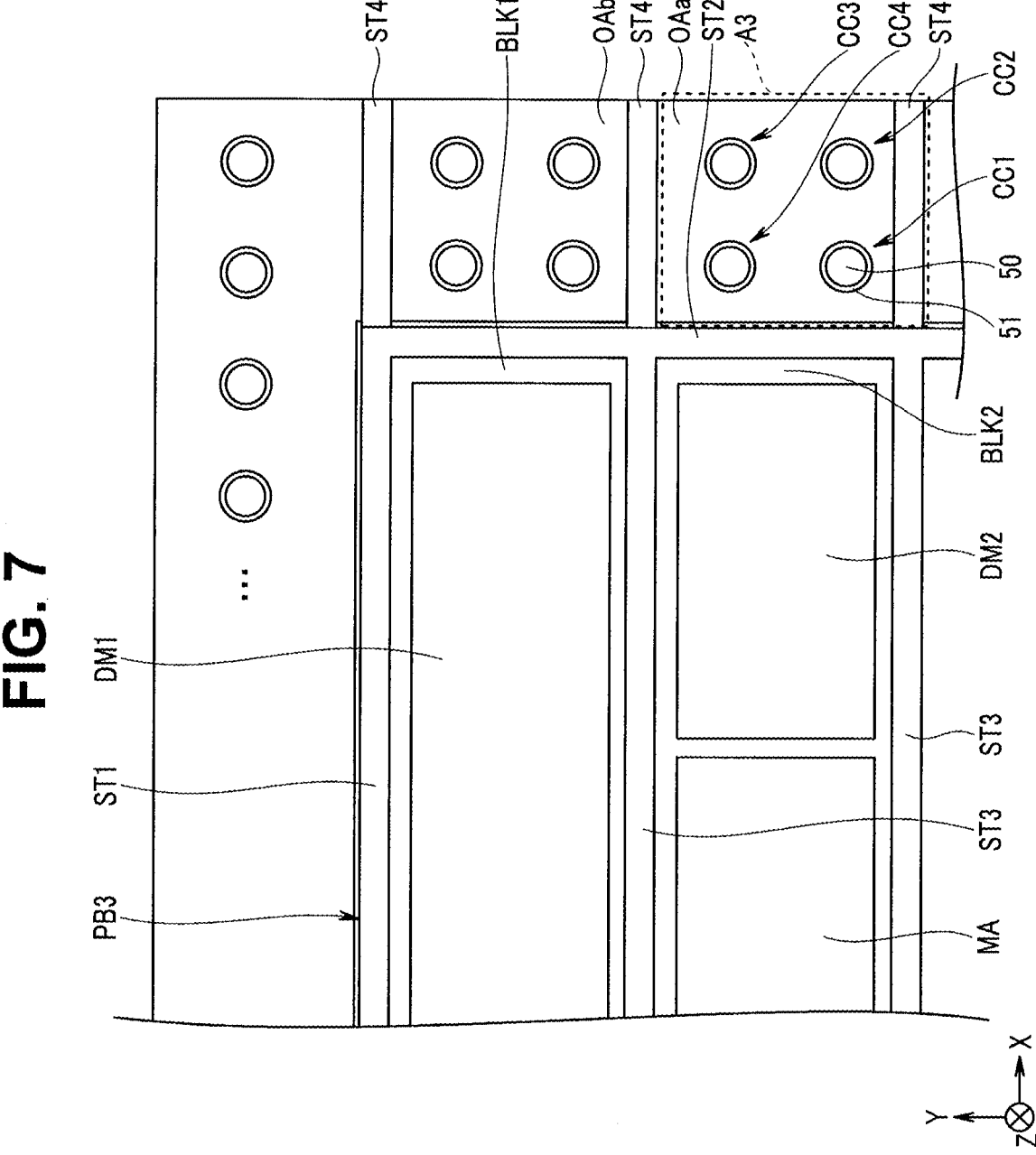
FIG. 7 is an enlarged view in which an end portion of a plane PB3 according to Modification 1 is enlarged.
Figure 8:
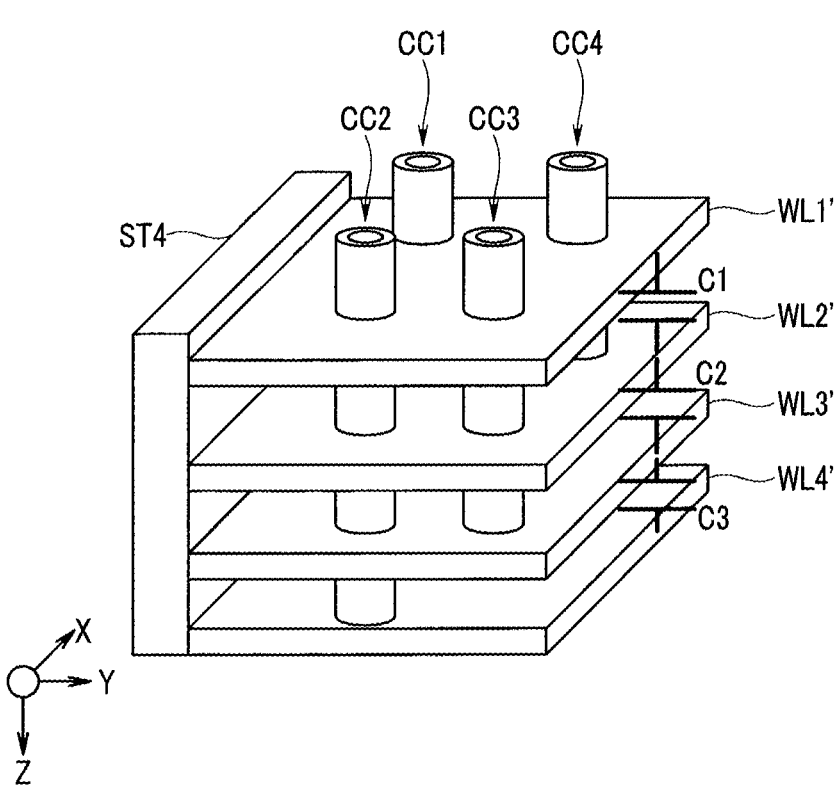
FIG. 8 is a perspective view showing one example of a stacked structure of a portion A3 that is a part of FIG. 7.

FIG. 7 is an enlarged view in which an end portion of a plane PB3 according to Modification 1 is enlarged. FIG. 8 is a perspective view showing an example of a stacked structure of a portion A3 that is a part of FIG. 7. Note that in FIG. 7, similar components to the components in FIG. 3 are assigned with the same reference signs, and explanation is omitted.

As shown in FIG. 7, the end portion of the plane PB3 has a plurality of insulation layers ST4 extending in the X direction from an insulation layer ST2. The plurality of insulation layers ST4 are formed in the X direction from the insulation layer ST2 to a perimeter of an array chip 1. The plurality of insulation layers ST4 are respectively formed to penetrate through a plurality of conductive layers WL' in the Z direction. The insulation layer ST4 is one example of a third insulation layer.

In each of regions OAa and OAb surrounded by the insulation layers ST2 and ST4 and the perimeter of the array chip 1, for example, four contact plugs CC1, CC2, CC3, and CC4 are formed.

As shown in FIG. 8, in the region OAa, the contact plug CC1 is provided on a conductive layer WL1' in contact with the conductive layer WL1'. The contact plug CC2 penetrates through the conductive layer WL1', a conductive layer WL2', and a conductive layer WL3', and is provided on a conductive layer WL4' in contact with the conductive layer WL4'. The contact plug CC3 penetrates trough the conductive layer WL1' and the conductive layer WL2', and is provided in contact with the conductive layer WL3'. The contact plug CC4 penetrates through the conductive layer WL1', and is provided in contact with the conductive layer WL2'.

By a configuration like this, a capacitive element having an interlayer capacitance C1 between the conductive layers WL1' and WL2' is provided between the contact plug CC1 and the contact plug CC4. A capacitive element having an interlayer capacitance C2 between the conductive layers WL2' and WL3' is provided between the contact plug CC3 and the contact plug CC4. A capacitive element having an interlayer capacitance C3 between the conductive layers WL3' and WL4' is provided between the contact plug CC2 and the contact plug CC3.

In the region OAb, a configuration of connection of four contact plugs CC and the conductive layers WL1' to WL4' is made a same configuration as the configuration shown in FIG. 8. It is possible to make the interlayer capacitances C1 to C3 to coincide with one another in the respective regions OAa and OAb by adding the plurality of insulation layers ST4, making the numbers of contact plugs that are formed in the respective regions OAa and OAb the same, and further making configurations of the connections of the conductive layers the same, in this way.

Modification 2

Next, Modification 2 will be described.

Figure 9:
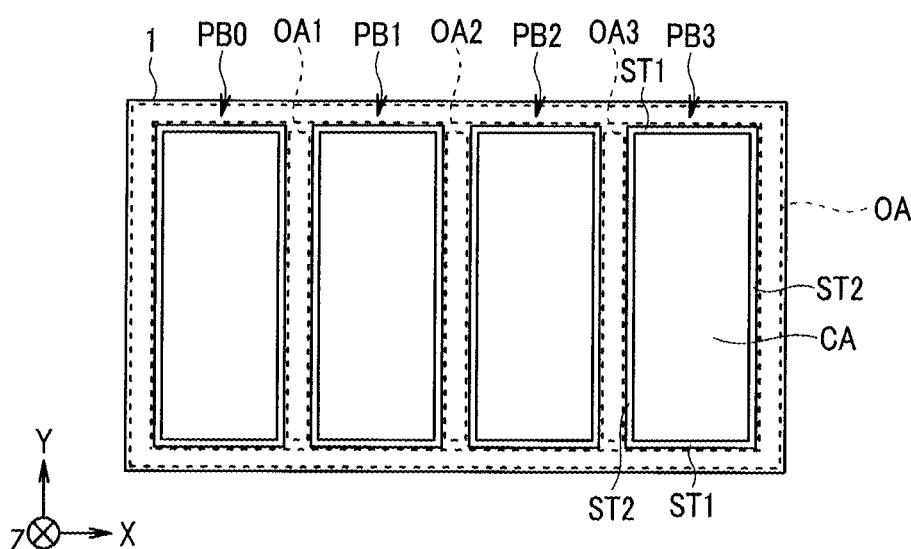
FIG. 9 is a plan view of one example of an array chip according to Modification 2.

FIG. 9 is a plan view of an example of an array chip according to Modification 2.

In the aforementioned embodiment, the plurality of contact plugs CC are formed in the region OA between the outsides of the insulation layers ST1 and ST2 and the perimeter of the array chip 1.

In contrast to this, in Modification 2, contact plugs CC are formed in regions among respective planes PB. More specifically, the plurality of contact plugs CC are formed in at least one region of a region OA1 between planes PB0 and PB1, a region OA2 between planes PB1 and PB2, and a region OA3 between planes PB2 and PB3. A capacitive element using an interlayer capacitance C between conductive layers WL' where the contact plugs CC are formed is configured.

Since in the regions among the respective planes PB, shapes of the conductive layers WL' are not guaranteed, it is desirable to use the capacitive elements using the interlayer capacitances C between the conductive layers WL' as capacitive elements for stabilizing power supply that does not require a capacitance guarantee. The capacitive elements for stabilizing power supply mean capacitive elements provided between a power supply line such as a voltage Vdd and a ground GND, for example.

The capacitive elements for stabilizing power supply are generally provided in a region where MOS transistors of a circuit chip 2 are formed. In the region, the capacitive elements for stabilizing power supply are configured as capacitive elements using capacitances between an active region where elements are formed and a gate provided above the active region via a thin insulation film. By replacing the capacitive elements with capacitive elements formed among the respective planes PB, it is possible to reduce a circuit area of the circuit chip 2, and it is possible to reduce manufacturing cost.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   at least one or more planes;
   a plurality of conductive layers and a plurality of insulation layers that are alternately stacked in a first direction (Z direction);
   a first contact plug that contacts a first conductive layer included in the plurality of conductive layers, and extends in the first direction, the first conductive layer being formed at an outside of an insulation layer configured to electrically separate the planes;

a second contact plug that contacts a second conductive layer that is a conductive layer directly above the first conductive layer of the plurality of conductive layers, and extends in the first direction through the first conductive layer, the second conductive layer being formed at an outside of the insulation layer configured to electrically separate the planes; and wherein the second contact plug includes a second conductor layer, and an insulation layer that is provided between the second conductor layer and the first conductive layer and insulates the second conductor layer and the first conductive layer.

2. The semiconductor storage device according to claim 1, wherein the first contact plug is formed of a first conductor layer, and an insulation layer disposed on an outside of the first conductor layer.

3. The semiconductor storage device according to claim 1, wherein the first conductive layer and the second conductive layer function as a capacitive element.

4. The semiconductor storage device according to claim 1, further comprising:

a plurality of third contact plugs that are formed to be in contact with the plurality of conductive layers in a stair form.

5. The semiconductor storage device according to claim 1, wherein the first contact plug and the second contact plug are formed between the outside of the insulation layer configured to electrically separate the planes and a perimeter of the semiconductor storage device.

6. The semiconductor storage device according to claim 1, wherein the insulation layer configured to electrically separate the planes includes a first insulation layer extending in a second direction (X direction), and a second insulation layer extending in a third direction (Y direction) orthogonal to the second direction, further includes a plurality of third insulation layers extending in the second direction from an end portion of the second insulation layer, and the first contact plug and the second contact plug are respectively formed in each of a plurality of regions surrounded by the second insulation layer, a perimeter of the semiconductor storage device, and the plurality of third insulation layers.

7. The semiconductor storage device according to claim 1, wherein when the semiconductor storage device includes two or more of the planes, the first contact plug and the second contact plug are formed in any one region between or among the two or more planes.

* * * * *